(12) United States Patent
Kisaki et al.

(10) Patent No.: US 11,388,819 B2
(45) Date of Patent: Jul. 12, 2022

(54) WIRING BOARD, ELECTRONIC DEVICE, AND ELECTRONIC MODULE

(71) Applicant: KYOCERA Corporation, Kyoto (JP)

(72) Inventors: Takuo Kisaki, Satsumasendai (JP); Keisuke Sawada, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/964,004

(22) PCT Filed: Jan. 24, 2019

(86) PCT No.: PCT/JP2019/002272
§ 371 (c)(1),
(2) Date: Jul. 22, 2020

(87) PCT Pub. No.: WO2019/146699
PCT Pub. Date: Aug. 1, 2019

(65) Prior Publication Data
US 2020/0352029 A1    Nov. 5, 2020

(30) Foreign Application Priority Data

Jan. 24, 2018 (JP) .............................. JP2018-009308
Jan. 25, 2018 (JP) .............................. JP2018-010360

(51) Int. Cl.
*H05K 1/11* (2006.01)
*H05K 1/18* (2006.01)
*H05K 5/02* (2006.01)

(52) U.S. Cl.
CPC ............ *H05K 1/113* (2013.01); *H05K 1/183* (2013.01); *H05K 5/0247* (2013.01); *H05K 2201/049* (2013.01); *H05K 2201/099* (2013.01); *H05K 2201/10015* (2013.01); *H05K 2201/10022* (2013.01); *H05K 2201/10068* (2013.01); *H05K 2201/10083* (2013.01); *H05K 2201/10378* (2013.01)

(58) Field of Classification Search
CPC .......... H05K 5/0247; H05K 1/11–113; H05K 1/18–181
USPC .................................................. 361/761–763
See application file for complete search history.

(56) References Cited

U.S. PATENT DOCUMENTS

| | | | |
|---|---|---|---|
| 8,476,538 B2* | 7/2013 | Eldridge | H05K 3/4647 174/262 |
| 8,785,791 B2* | 7/2014 | Yamamoto | H05K 3/101 174/264 |
| 8,928,153 B2* | 1/2015 | Haba | H01L 25/16 257/777 |

(Continued)

FOREIGN PATENT DOCUMENTS

| | | |
|---|---|---|
| JP | 2001-196488 A | 7/2001 |
| JP | 2004-179198 A | 6/2004 |
| JP | 2013-165149 A | 8/2013 |

*Primary Examiner* — Hoa C Nguyen
(74) *Attorney, Agent, or Firm* — Volpe Koenig

(57) ABSTRACT

A wiring board includes an insulating substrate, at least one external electrode disposed on a first surface of the insulating substrate, and wiring that is disposed in the insulating substrate and that is electrically connected to the at least one external electrode. The wiring includes a portion where an extension direction of the wiring is inclined relative to the first surface of the insulating substrate.

23 Claims, 4 Drawing Sheets

(56) References Cited

U.S. PATENT DOCUMENTS

| | | | | |
|---|---|---|---|---|
| 2003/0111727 A1* | 6/2003 | Kurusu | ................... | H05K 1/111 |
| | | | | 257/730 |
| 2004/0238857 A1* | 12/2004 | Beroz | ..................... | H01L 23/36 |
| | | | | 257/232 |
| 2009/0072370 A1* | 3/2009 | Horiuchi | ............. | H01L 21/4857 |
| | | | | 257/676 |
| 2009/0145648 A1* | 6/2009 | Horiuchi | ................ | H05K 3/222 |
| | | | | 174/260 |
| 2009/0256268 A1* | 10/2009 | Ayotte | ................. | H05K 3/3436 |
| | | | | 257/778 |
| 2010/0148360 A1* | 6/2010 | Lin | ..................... | H01L 25/0655 |
| | | | | 257/737 |
| 2014/0353807 A1* | 12/2014 | Welch | ................... | H01L 23/552 |
| | | | | 257/659 |
| 2015/0201500 A1* | 7/2015 | Shinar | ................... | B29C 64/135 |
| | | | | 425/132 |

\* cited by examiner

US 11,388,819 B2

WIRING BOARD, ELECTRONIC DEVICE, AND ELECTRONIC MODULE

TECHNICAL FIELD

The present disclosure relates to a wiring board, an electronic device, and an electronic module.

BACKGROUND ART

There is a package-shaped wiring board to be connected to an external device for use.

In this wiring board, an external connection pad that electrically connects wiring to the outside is disposed on an outer surface. There exists a technique in which wiring is vertically and horizontally formed by combining planar wiring (wiring pattern) provided on insulating members with through vias (via conductors) penetrating through the insulating members in a multilayer board.

There also exists a technique in which an end portion of an external connection pad has a form that is embedded into a ceramic board so as to reinforce the adherence of the end portion to the ceramic board, thereby preventing degradation of adhering properties of the external connection pad (see Japanese Unexamined Patent Application Publication No. 2013-165149).

SUMMARY OF INVENTION

Solution to Problem

A wiring board according to an aspect of the present disclosure includes
  an insulating substrate,
  at least one external electrode disposed on a first surface of the insulating substrate, and
  wiring that is disposed in the insulating substrate and that is electrically connected to the at least one external electrode.

The wiring includes a portion where an extension direction of the wiring is inclined relative to the first surface.

An electronic device according to an aspect of the present disclosure includes
  the above-described wiring board and
  an electronic component connected to the wiring board.

An electronic module according to an aspect of the present disclosure includes
  the above-described electronic device and
  a module board connected to the electronic device.

Advantageous Effects of Invention

According to the content of the present disclosure, there is obtained an effect of allowing more flexible setting of a wiring length in the wiring board.

DESCRIPTION OF EMBODIMENTS

An embodiment according to the present disclosure is described below with reference to the drawings.

Figure 1A:
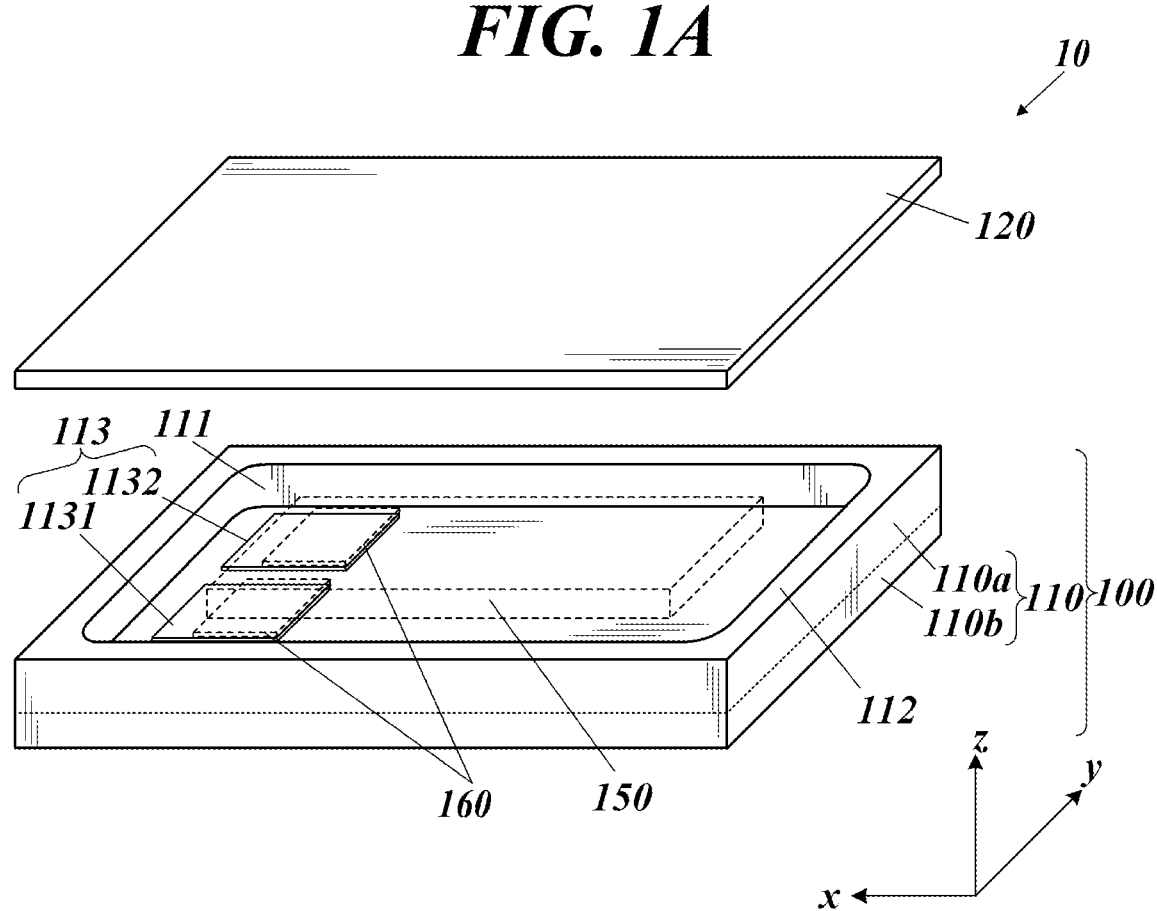
FIG. 1A is an overall perspective view of an electronic device with a lid body removed.
Figure 1B:
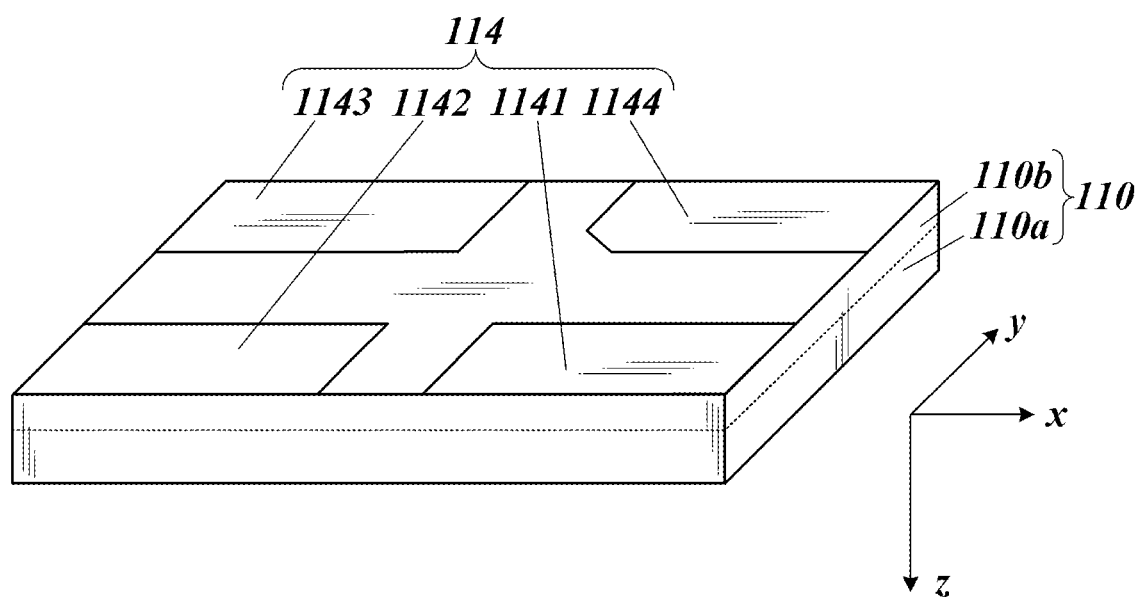
FIG. 1B is an overall perspective view of a lower surface side of the electronic device.

FIGS. 1A and 1B are overall perspective views of an electronic device 10 of the present embodiment with a lid body 120 removed. FIG. 1A illustrates an upper surface on a side where the lid body 120 is to be joined, and FIG. 1B illustrates a lower surface opposite the side where the lid body 120 is to be joined The electronic device 10 includes a wiring board 100, an electronic component 150, the lid body 120, and so forth. The wiring board 100 includes an insulating substrate 110, electrodes (connection pads 113 and external connection pads 114), wring, and so forth. An accommodation section 111 (recess section) that is a region having a recessed shape is disposed in one surface of the insulating substrate 110 where the lid body 120 is to be joined (the upper side in the z direction, an upper surface, a second surface opposite a first surface). The electronic component 150 is disposed in the accommodation section 111. A frame-shaped metalized layer 112 is disposed on a joining surface, to be joined to the lid body 120, of a frame part 110a, which forms surfaces of the accommodation section 111 other than an opened surface and a bottom surface opposite the opened surface (placement surface for the electronic component 150), that is, side surfaces of the accommodation section 111 (here, each of the side surfaces is parallel to the z direction). The frame-shaped metalized layer 112 is joined to the lid body 120 with a sealing material such as a gold tin alloy (AuSn) or a silver brazing alloy. Although it is not particularly limited, here, the size of the wiring board 100 is as follows: a side in an xy plane is about 0.8 to 10.0 mm and the thickness in the z direction is about 0.1 to 2.0 mm.

In a base part 110b of the insulating substrate 110 that forms the bottom surface of the accommodation section 111 (placement surface for the electronic component 150), a first connection pad 1131 and a second connection pad 1132 (collectively referred to as connection pads 113, connection electrodes) are disposed on the bottom surface. When the electronic component 150 is attached to the connection pads 113 (connected to the wiring board 100), the electronic device 10 that includes the wiring board 100 and the electronic component 150 is formed.

The electronic component 150 and the connection pads 113 are connected to each other with a joining material 160 such as a conductive adhesive (for example, resin to which silver or other conductive particles are added). When the joining material 160 is thermosetting, the joining material 160 is applied to the connection pads 113 in advance, and heat is applied with the electronic component 150 positioned relative to the connection pads 113 (joining material 160). Thus, the electronic component 150 is connected to the connection pads 113 through the joining material 160. The connection pads 113 have a projecting shape relative to the bottom surface of the accommodation section 111. Thus, the electronic component 150 is secured and separated from the bottom surface in the accommodation section 111. When the electronic component 150 generates, for example, vibration during operation, the thickness of the connection pads 113 and the joining material 160 can be determined such that the electronic component 150 is not brought into contact with the bottom surface and the lid body 120 in the accommodation section 111 during vibration.

A first external connection pad 1141, a second external connection pad 1142, a third external connection pad 1143, and a fourth external connection pad 1144 (collectively referred to as the external connection pads 114, external electrodes) are respectively disposed at four corners of a surface of the base part 110b opposite the accommodation section 111 (lower surface, first surface). The external connection pads 114 are external electrodes to be joined to a module board 200 (module board).

Figure 3A:
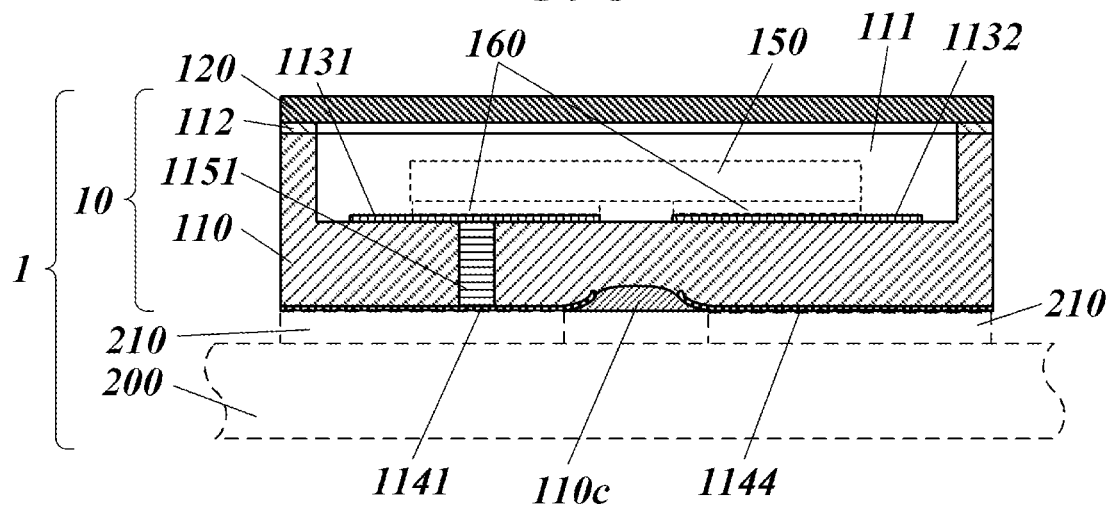
FIG. 3A is a sectional view of an electronic module.

The electronic device 10 that includes the wiring board 100 and the electronic component 150 disposed in the accommodation section 111 of the wiring board 100 is included in an electronic module 1 (see FIG. 3A) together with the module board 200 (see FIG. 3A) to which the external connection pads 114 are joined with solder 210 (see FIG. 3A). Examples of the electronic component 150 include, but not limited to, for example, a crystal resonator, a surface acoustic wave element (SAW filter), and the like. Any one of a variety of electronic components such as a piezoelectric element, a capacitive element, a resistance element, and so forth for other purposes may be used. A plurality of electronic components 150 may be disposed in a single accommodation section 111 according to need.

The insulating substrate 110 is formed of a ceramic material, such as, for example, an aluminum oxide-based sintered body, an aluminum nitride-based sintered body, a mullite-based sintered body, or a glass-ceramic sintered body. Here, it is assumed that the insulating substrate 110 is formed of an aluminum oxide-based sintered body (alumina-based sintered body) for description. The frame part 110a and the base part 110b of the insulating substrate 110 are integrated with each other.

The lid body 120 is formed of conductive metal and is joined to the frame-shaped metalized layer 112, thereby hermetically sealing the accommodation section 111. For sealing, a conductive sealing member (sealing material) such as AuSn or a silver brazing alloy is used. The lid body 120 is grounded so as to suppress propagation of external noise into the accommodation section 111. The lid body 120 is connected to the external connection pads 114 of the wiring board 100 through the conductive sealing member and the frame-shaped metalized layer 112. When the external connection pads 114 are grounded, the lid body 120 is grounded.

The frame-shaped metalized layer 112 is formed of conductive metal by printing on the joining surface of the frame part 110a.

The frame-shaped metalized layer 112, exposed surfaces of the connection pads 113, exposed surfaces of the external connection pads 114, and so forth may be coated with nickel-plated layers and/or gold-plated layers. For example, nickel-plated layers are provided on the exposed surfaces to a thickness of 1 to 20 µm, and a gold-plated layers are provided on these nickel-plated layers to a thickness of 0.1 to 3.0 µm. In this way, oxidation corrosion of the surfaces is suppressed, and connection between the frame-shaped metalized layer 112 disposed on the upper surface of the insulating substrate 110 that is an insulating body and the lid body 120 that is a metal conductor can be facilitated and strengthened.

Next, electrical wiring of the wiring board 100 is described.

Figure 2:
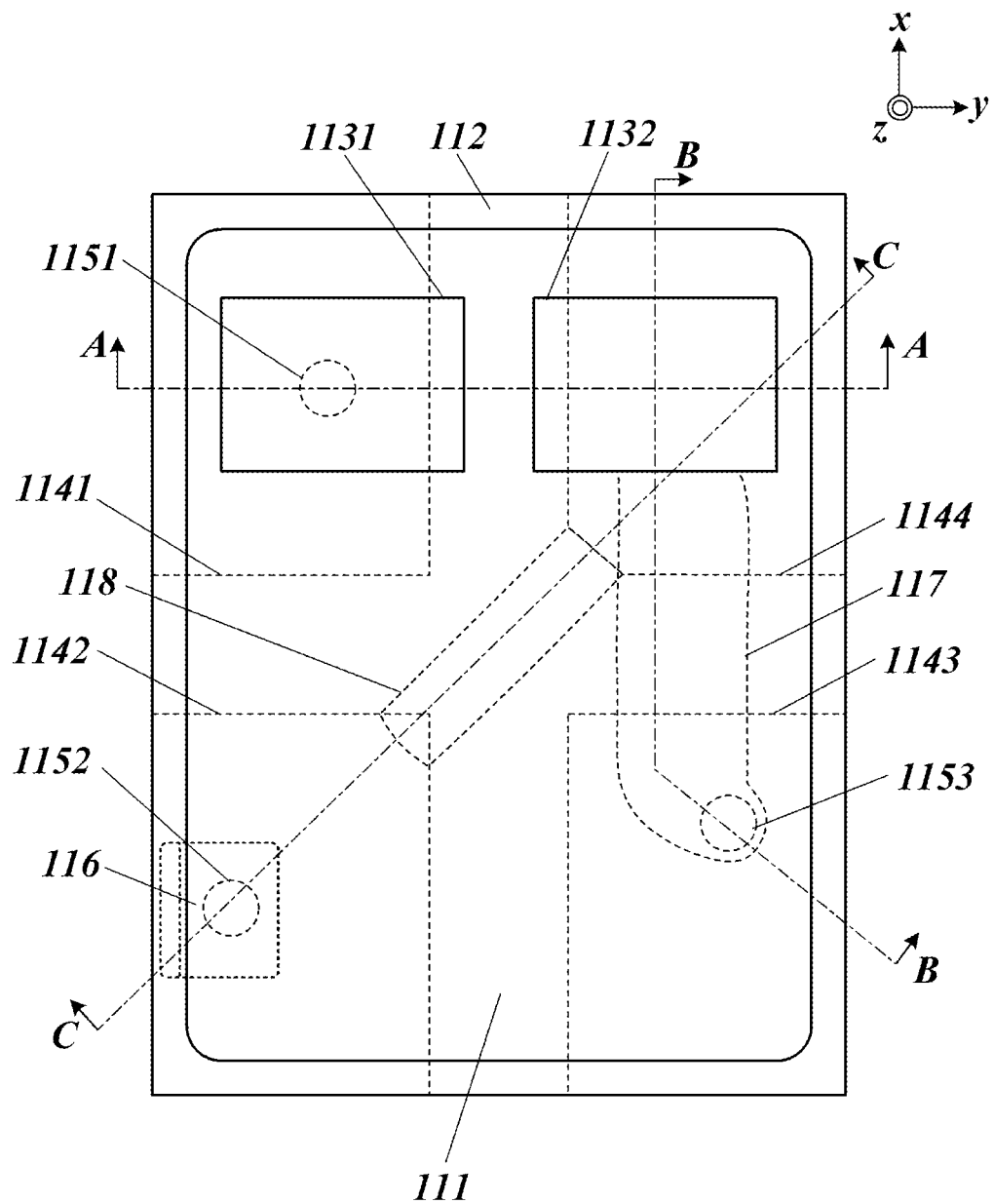
FIG. 2 is a plan view of a wiring board seen from an upper side.

FIG. 2 is a plan view of the wiring board 100 seen from the upper side. In this plan view, internal wiring and the electrodes are also illustrated.

The first connection pad 1131 on the bottom surface of the accommodation section 111 is connected to the external connection pad 1141 immediate therebelow through a through conductor 1151 that vertically penetrates through the base part 110b. The second connection pad 1132 is connected to the external connection pad 1143 through an embedded wiring 117 and a via conductor 1153 disposed in the base part 110b.

The frame-shaped metalized layer 112 is connected to the external connection pad 1142 through an intra-frame wiring 116 and a via conductor 1152 disposed in the frame part 110a. The external connection pad 1142 and the external connection pad 1144 are connected to each other through inclined wiring 118 disposed in the base part 110b (wiring provided in the insulating substrate 110).

The first external connection pad 1141 and the third external connection pad 1143 are electrodes to which a potential corresponding to a supply voltage to the electronic component 150 is applied. Both the second external connection pad 1142 and the fourth external connection pad 1144 are electrodes to be grounded here. When the second external connection pad 1142 and the fourth external connection pad 1144 are grounded, the frame-shaped metalized layer 112 is grounded.

Figure 3B:
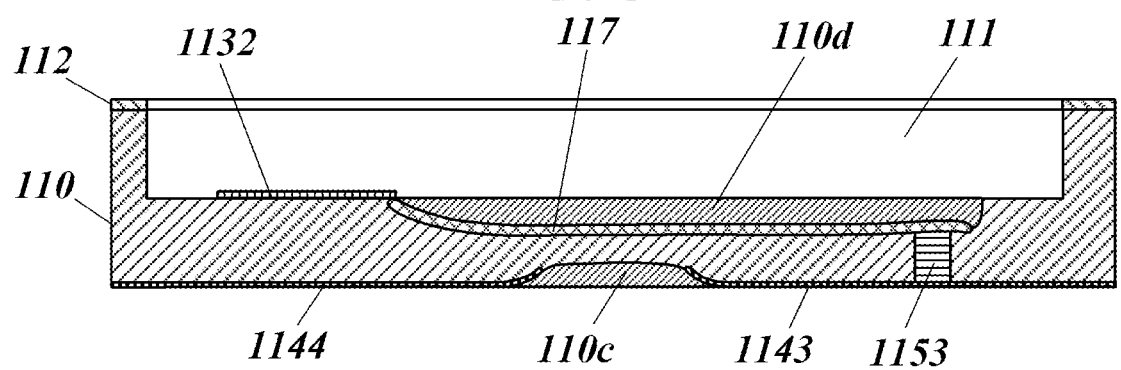
FIG. 3B is a sectional view of the wiring board.
Figure 3C:
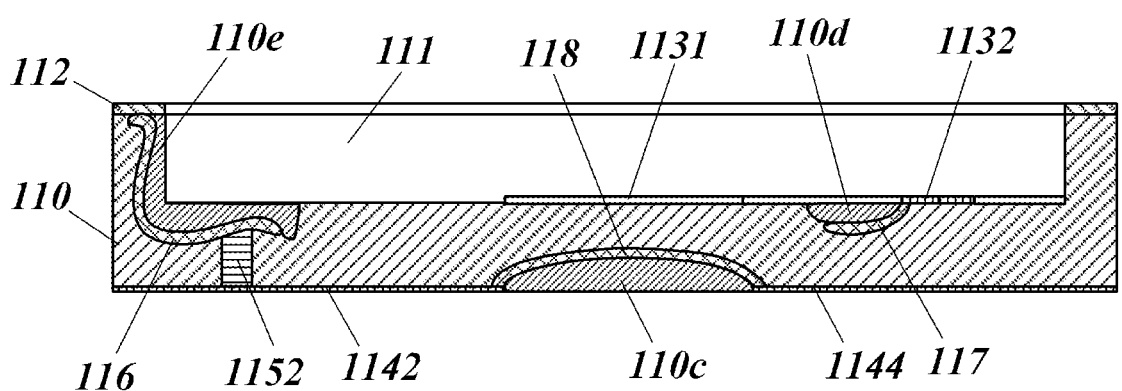
FIG. 3C is a sectional view of the wiring board.

FIGS. 3A to 3C are sectional views of the wiring board 100 respectively taken along three section lines illustrated in plan view of FIG. 2.

FIG. 3A illustrates the entirety of the electronic module 1 that includes the electronic component 150 connected to the connection pads 113, the lid body 120 joined to the frame-shaped metalized layer 112, and the module board 200 connected to the external connection pads 114 through the solder 210 (as the electronic module 1, the electronic device 10 is attached to the module board 200).

FIG. 3A is a sectional view taken along section line A-A including the connection pads 113. The first connection pad 1131 is connected to the first external connection pad 1141 through the through conductor 1151. A coating layer 110c formed of the same material as the material of the insulating substrate 110, that is, aluminum oxide-based ceramic paste here is provided on the lower surface of the insulating substrate 110 (base part 110b). With this coating layer 110c, end portions of the first external connection pad 1141 and the fourth external connection pad 1144 are disposed inside the insulating substrate 110.

FIG. 3B is a sectional view of the wiring board 100 taken along section line B-B including the second connection pad 1132 and the embedded wiring 117. One end of the embedded wiring 117 is connected to an end portion of the second connection pad 1132 on the rear side. Other portions of the embedded wiring 117 are coated with a coating layer 110d with which an upper portion of the embedded wiring 117 is coated at the bottom surface of the accommodation section 111. Thus, the embedded wiring 117 is not exposed in the surface of the wiring board 100. A rear surface of the third external connection pad 1143 (opposite an exposed surface) is in contact with a lower end of the via conductor 1153, and an upper end of the via conductor 1153 is in contact with a region of the embedded wiring 117 near an end portion opposite the above-described one end.

In addition to the fourth external connection pad 1144, an end portion of the third external connection pad 1143 is coated with the coating layer 110c and disposed inside the insulating substrate 110. Here, the material of the coating layer 110d is the same as the material of the coating layer 110c.

FIG. 3C is a sectional view of the wiring board 100 taken along section line C-C including the second external connection pad 1142, the fourth external connection pad 1144, and the inclined wiring 118. One end of the intra-frame wiring 116 is in contact with a side of the frame-shaped metalized layer 112 opposite a joining surface of the frame-shaped metalized layer 112 joined to the lid body 120 and coated with a coating layer 110e provided so as to face the accommodation section 111. Thus, the intra-frame wiring 116 is not exposed to the outside. The intra-frame wiring 116 is in contact with the upper end of the via conductor 1152 at a region thereof near the other end opposite the above-described one end. The lower end of the via conductor 1152 is in contact with the second external connection pad 1142. The material of the coating layer 110e may be the same as the material of the coating layers 110c, 110d.

The inclined wiring 118 electrically connected to the second external connection pad 1142 and the fourth external connection pad 1144 is in contact with the second external connection pad 1142 and the fourth external connection pad 1144 at respective ends thereof and electrically connects the second external connection pad 1142 and the fourth external connection pad 1144 to each other. With the above-described coating layer 110c, portions of the inclined wiring 118 other than both the ends are disposed inside the insulating substrate 110.

The inclined wiring 118 includes portions an extension direction of which (that is, a direction connecting the second external connection pad 1142 and the fourth external connection pad 1144) is inclined in inclination directions relative to the lower surface of the insulating substrate 110. That is, the distance between the inclined wiring 118 and the lower surface of the insulating substrate 110 (thickness of the coating layer 110c) varies in the extension direction of the inclined wiring 118. The thickness of the coating layer 110c is zero at the positions of both the ends of the inclined wiring 118 and increases toward the center. Thus, the inclined wiring 118 extends inside the insulation substrate 110 from both the ends of the inclined wiring 118 so as to be inclined relative to the lower surface of the insulating substrate 110. The inclination angle of the inclined wiring 118 relative to the lower surface of the insulating substrate 110 and the length of inclined portions of the inclined wiring 118 may be appropriately determined in accordance with the wiring length and/or the positional relationship with other wiring of the inclined wiring 118. The inclination angle is not necessarily uniform (that is, the inclined wiring 118 is not necessarily linear in sectional view). Here, the inclined wiring 118 has a curved shape in sectional view.

Next, an example of a method of manufacturing the wiring board 100 is described.

First, a through hole is provided in a ceramic green sheet that becomes the insulating substrate 110 and a conductor is injected into the through hole so as to form the through conductor 1151 and the via conductors 1152, 1153.

Metalized paste is applied (for example, by screen printing) with a mask to the positions of the connection pads 113 and appropriate positional ranges for forming the intra-frame wiring 116 and the embedded wiring 117 on the ceramic green sheet. Ceramic paste the material of which is the same as that of the ceramic green sheet is applied (for example, by screen printing) with a mask in appropriate positional ranges that cover regions of the metalized paste corresponding to the intra-frame wiring 116 and the embedded wiring 117.

On a lower surface side of the ceramic green sheet, metalized paste is applied with a mask to the positions of the external connection pads 114. The second external connection pad 1142 and the fourth external connection pad 1144 are connected to each other through the metalized paste applied at the position of the inclined wiring 118 in bottom view. The ceramic paste is further applied with a mask so as to be superposed on a region from gaps between the external connection pads 114 (including portions where the metalized paste is applied) toward regions near inside boundaries of the external connection pads 114. At this time, in accordance with, for example, the inclination angle of the inclined wiring 118, the applying amount of the ceramic paste may be increased or decreased or is not necessarily uniform.

The ceramic green sheet to which the metalized paste and the ceramic paste are applied at both surfaces is placed on a flat plate and is pressurized from an upper surface side with a pressurizing tool having an irregular shape corresponding to the accommodation section 111, the frame part 110a, and the connection pads 113. This causes the metalized paste and the ceramic paste having been applied to an upper surface side to be pressed down to the height of the bottom surface of the accommodation section 111. This also causes part of the metalized paste corresponding to the embedded wiring 117 and a portion of the intra-frame wiring 116 extending below the accommodation section 111 to be interposed between the coating layers 110d, 110e and the ceramic green sheet and embedded. The upper ends of the via conductors 1152, 1153 are pressed downward by the metalized paste and the ceramic paste to have shapes that do not penetrate through the bottom surface of the accommodation section 111 from the bottom surface of the insulating substrate 110.

The ceramic green sheet, the metalized paste, and the ceramic paste are deformed and filled into a recess of the pressurizing tool, thereby the metalized paste interposed between the coating layer 110e and the ceramic green sheet is, corresponding to the intra-frame wiring 116, embedded and formed in the frame part 110a.

On the lower surface side, the metalized paste and the ceramic paste have a planar shape, thereby the four external connection pads 114 are formed. Inner end portions of the external connection pads 114 are pressed into the insulating substrate 110 by the ceramic paste. The metalized paste connecting the second external connection pad 1142 and the fourth external connection pad 1144 to each other is, by the ceramic paste, pressed into the insulating substrate 110 and forms the inclined wiring 118.

In this way, the coating layers 110c to 110e and the ceramic green sheet are integrated with each other, thereby providing the wiring board 100 in which the metalized paste interposed between the coating layers 110c to 110e and the ceramic green sheet becomes the intra-frame wiring 116, the embedded wiring 117, and the inclined wiring 118 that are not exposed other than in joining surfaces where the intra-frame wiring 116, the embedded wiring 117, and the inclined wiring 118 are respectively joined to the frame-shaped metalized layer 112, one of the connection pads 113, and the external connection pads 114. Then, plating, firing, attachment of the electronic component 150, joining of the lid body 120, and so forth are performed according to need.

[Variations]

Figure 4:
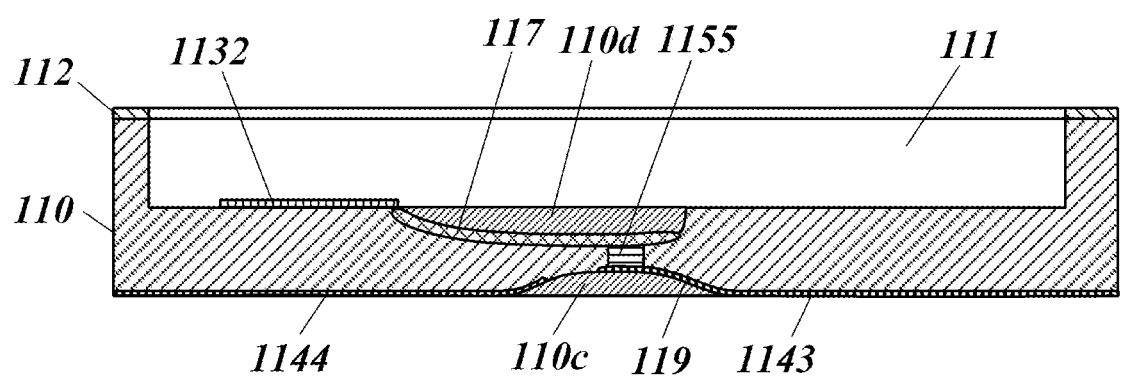
FIG. 4 is a sectional view illustrating a variation of wiring of the wiring board.

FIG. 4 is a sectional view illustrating a variation of the wiring illustrated in FIG. 3B.

According to the above-described embodiment, the one end of the embedded wiring 117 is in contact with the second connection pad 1132, and the other end of the embedded wiring 117 is in contact with the third external connection pad 1143 through the via conductor 1153 disposed immediately above the third external connection pad 1143. According to this variation, a via conductor 1155 is disposed between the second connection pad 1132 and the third external connection pad 1143 in a direction along the section (x direction). An inner end portion of the third external connection pad 1143 extends to a position immediately below the via conductor 1155 and is lifted upward due to application of pressure to the ceramic paste disposed therebelow. Thus, the third external connection pad 1143 and the second connection pad 1132 are connected to each other through inclined wiring 119 in contact with the third external connection pad 1143.

As described above, the wiring board 100 according to the present embodiment includes the insulating substrate 110, the external connection pads 114 disposed on the lower surface of the insulating substrate 110, and the inclined wiring 118 that is disposed in the insulating substrate 110 and electrically connected to the external connection pads 114. The inclined wiring 118 includes portions the extension direction of which is inclined relative to the lower surface of the insulating substrate 110.

When wiring in the inclination direction is included in addition to wiring perpendicular to or horizontal to the lower surface of the insulating substrate 110 as described above, the wiring length with respect to the positional relationship of both the ends can be more flexibly set. This can also improve, in the wiring board 100, versatility in disposition of components, electrodes, via conductors, and so forth at both the ends, and accordingly, appropriate design of the board can be facilitated. Since the number of connections between the via conductors and planar wiring can be reduced, the electrical characteristics can be stabilized more by using this wiring board 100.

The connection pads 113 which are electrically connected to the external connection pads 114 and on which the electronic component 150 is placed are disposed on the bottom surface of the accommodation section 111 opposite the lower surface of the insulating substrate 110.

When efficiency of wiring from the external connection pads 114 for external connection is increased as described above, versatility in the design of the connection pads 113 and wiring connected to the connection pads 113 in the wiring board 100 can be improved.

The insulating substrate 110 has the accommodation section 111 having a recess section shape in the upper surface thereof, and the connection pads 113 are disposed on the bottom surface of the recess section. When wiring that is in contact with the external connection pads 114 and disposed in the base part 110b of the insulating substrate 110 is inclined in the wiring board 100 having a package shape as described above, a small package can be efficiently and flexibly formed.

The inclined wiring 118 electrically connects the plurality of external connection pads 114. That is, the external connection pads 114 disposed in the same plane can be connected to each other through a single piece of the wiring. Thus, in the wiring board 100, wiring of appropriate lengths and routes can be easily obtained without time and effort for using via conductors or exposure of the wiring.

The electronic device 10 according to the present embodiment includes the above-described wiring board 100 and the electronic component 150 connected to the wiring board 100. Accordingly, by using the wiring board 100, the external connection pads 114 can be more appropriately and flexibly disposed without an increase in size. Thus, the electronic device 10 can be attached to various electronic modules 1 with efficiency and high density.

The electronic module 1 according to the present embodiment includes the above-described electronic device 10 and the module board 200 to which the electronic device 10 is connected. The inclined wiring 118 allows appropriate setting of the wiring length. This improves versatility in the design of the wiring board 100. Thus, in the electronic module 1, many electronic devices 10 and components can be more efficiently disposed on the module board 200, and accordingly, an increase in the size of the electronic module 1 can be suppressed and the function of the electronic module 1 can be improved.

The above-described embodiment is exemplary, and various changes can be made to the embodiment.

For example, according to the above-described embodiment, the example of the inclined wiring 118 between two of the external connection pads 114 is described, and according to the variation, the example of the inclined wiring 119 between one of the connection pads 113 and a corresponding one of the external connection pads 114 through the via conductor 1155 is described. However, electrical paths formed by the inclined wiring are not limited to these. The inclined wiring may connect the external connection pads 114 and conductors of another structure.

In the description according to the above-described embodiment, the length of the inclined wiring 118 in the wiring direction is greater than the width of the inclined wiring 118 in a direction perpendicular to the wiring direction. However, it is not limiting. The length of the inclined wiring 118 in the wiring direction may be small or the width of the inclined wiring 118 in the direction perpendicular to the wiring direction may be large.

In the description according to the above-described embodiment, the position of the inclined wiring 118 in the z direction is uniform in the direction perpendicular to the extension direction of the inclined wiring 118. However, the inclined wiring 118 may be inclined in the direction perpendicular to the extension direction. That is, the inclined wiring 118 may have a portion turned about the extension direction (twisted portion).

The number of electronic components 150 disposed in the accommodation section 111 is not limited to one. A plurality of the electronic components 150 may be disposed in the accommodation section 111. Also, a plurality of accommodation sections 111 may be provided. The numbers, disposition, the connection relationships, or the like of the connection pads 113 and the external connection pads 114 are not limited to those described in the example. The numbers, disposition, the connection relationships, and the like of the connection pads 113 and the external connection pads 114 may be appropriately determined in accordance with the numbers, the shapes, the structures, and the like of such accommodation sections 111, electronic components 150, and module boards 200. Also, the shapes of the connection pads 113 and the external connection pads 114 may be changed.

Although the lid body 120 is included in the electronic device 10 in the description according to the above-described embodiment, the lid body 120 is not necessarily included in the electronic device 10.

Formation of the inclined wiring 118 is not limited to the above-described method of manufacturing. The inclined wiring 118 may be formed by any method.

In addition to the above description, the specific details of the specific structures, shapes, disposition, positional relationships, and the like described for the above-described embodiment can be appropriately changed without departing from the gist of the present disclosure.

INDUSTRIAL APPLICABILITY

The content of the present disclosure can be utilized for a wiring board, an electronic device, and an electronic module.

The invention claimed is:

1. A wiring board comprising:
an insulating substrate;
at least one external electrode disposed on a first surface of the insulating substrate;
wiring that is disposed in the insulating substrate and that is electrically connected and physically connected to the at least one external electrode; and
a via conductor that extends from a second surface opposite the first surface of the insulating substrate into the insulating substrate, wherein
the wiring comprises a portion where an extension direction of the wiring is inclined relative to the first surface,
the insulating substrate is made of ceramic,
the wiring is composed of metalized wiring having a ribbon shape
the portion of the wiring includes at least one end of the wiring so that the wiring extends from the first surface into the insulating substrate in an inclined direction relative to the first surface,
the one end of the wiring is connected to the at least one external electrode on the first surface, and another end of the wiring is connected to the via conductor in the insulating substrate.

2. The wiring board according to claim 1, wherein
a connection electrode which is electrically connected to the at least one external electrode and on which an electronic component is to be placed is disposed on a second surface of the insulating substrate opposite the first surface.

3. The wiring board according to claim 2, wherein
the second surface comprises a recess section, and the connection electrode is disposed on a bottom surface of the recess section.

4. The wiring board according to claim 3, wherein
the at least one external electrode comprises a plurality of external electrodes, and wherein
the wiring electrically connects the plurality of external electrodes to each other.

5. An electronic device comprising:
the wiring board according to claim 4; and
an electronic component connected to the wiring board.

6. An electronic module comprising:
the electronic device according to claim 5; and
a module board connected to the electronic device.

7. An electronic device comprising:
the wiring board according to claim 3; and
an electronic component connected to the wiring board.

8. An electronic module comprising:
the electronic device according to claim 7; and
a module board connected to the electronic device.

9. The wiring board according to claim 2, wherein
the at least one external electrode comprises a plurality of external electrodes, and wherein
the wiring electrically connects the plurality of external electrodes to each other.

10. An electronic device comprising:
the wiring board according to claim 9; and
an electronic component connected to the wiring board.

11. An electronic module comprising:
the electronic device according to claim 10; and
a module board connected to the electronic device.

12. An electronic device comprising:
the wiring board according to claim 2; and
an electronic component connected to the wiring board.

13. An electronic module comprising:
the electronic device according to claim 12; and
a module board connected to the electronic device.

14. The wiring board according to claim 1, wherein
the at least one external electrode comprises a plurality of external electrodes, and wherein
the wiring electrically connects the plurality of external electrodes to each other.

15. An electronic device comprising:
the wiring board according to claim 14; and
an electronic component connected to the wiring board.

16. An electronic module comprising:
the electronic device according to claim 15; and
a module board connected to the electronic device.

17. An electronic device comprising:
the wiring board according to claim 1; and
an electronic component connected to the wiring board.

18. An electronic module comprising:
the electronic device according to claim 17; and
a module board connected to the electronic device.

19. The wiring board according to claim 1, wherein
a width direction of the ribbon shape of the wiring is substantially parallel to the first surface.

20. A wiring board comprising:
an insulating substrate;
a first electrode disposed on a first surface of the insulating substrate;
first wiring disposed in the insulating substrate; and
a via conductor disposed in the insulating substrate, wherein
one end of the first wiring is connected to the first electrode on the first surface,
another end of the first wiring is connected to the via conductor in the insulating substrate, and
the first wiring comprises a portion where an extension direction of the first wiring is inclined relative to the first surface, the portion including the one end of the first wiring so that the first wiring extends from the first surface into the insulating substrate in an inclined direction relative to the first surface.

21. The wiring board according to claim 20, further comprising:
a second electrode disposed on a second surface of the insulating substrate opposite the first surface, wherein
the via conductor is connected to the second electrode so that the first electrode is electrically connected to the second electrode via the first wiring and the via conductor.

22. The wiring board according to claim 20, further comprising:
a second electrode disposed on a second surface of the insulating substrate opposite the first surface; and
second wiring disposed in the insulating substrate, wherein
one end of the second wiring is connected to the second electrode on the second surface, and
another end of the second wiring is connected to the via conductor in the insulating substrate so that the first electrode is electrically connected to the second electrode via the first wiring, the via conductor and the second wiring.

23. The wiring board according to claim 22, wherein the second wiring comprises a portion where an extension direction of the second wiring is inclined relative to the second surface, the portion including the one end of the second wiring so that the second wiring extends from the second surface into the insulating substrate in an inclined direction relative to the second surface.

\* \* \* \* \*